(12) United States Patent
Sneh et al.

(10) Patent No.: US 6,897,119 B1
(45) Date of Patent: May 24, 2005

(54) APPARATUS AND METHOD TO ACHIEVE CONTINUOUS INTERFACE AND ULTRATHIN FILM DURING ATOMIC LAYER DEPOSITION

(75) Inventors: Ofer Sneh, Mountain View, CA (US); Thomas E. Seidel, Sunnyvale, CA (US); Carl Galewski, Aromas, CA (US)

(73) Assignee: Genus, Inc., Sunnyvale, CA (US)

( * ) Notice: Subject to any disclaimer, the term of this patent is extended or adjusted under 35 U.S.C. 154(b) by 0 days.

(21) Appl. No.: 10/666,694

(22) Filed: Sep. 18, 2003

Related U.S. Application Data

(62) Division of application No. 10/256,899, filed on Sep. 27, 2002, now Pat. No. 6,638,859, which is a division of application No. 09/470,279, filed on Dec. 22, 1999, now Pat. No. 6,503,330.

(51) Int. Cl.$^7$ .............................................. H01L 21/76
(52) U.S. Cl. ...................................... 438/400; 438/584
(58) Field of Search .................................. 438/584, 400, 438/680

(56) References Cited

U.S. PATENT DOCUMENTS 6,203,613 B1 * 3/2001 Gates et al. ................ 117/104

* cited by examiner

Primary Examiner—W. David Coleman
(74) Attorney, Agent, or Firm—Blakely Sokoloff Taylor & Zafman LLP

(57) ABSTRACT

A method and apparatus for performing atomic layer deposition in which a surface of a substrate is pretreated to make the surface of the substrate reactive for performing atomic layer deposition.

3 Claims, 4 Drawing Sheets

APPARATUS AND METHOD TO ACHIEVE CONTINUOUS INTERFACE AND ULTRATHIN FILM DURING ATOMIC LAYER DEPOSITION

CROSS-REFERENCE TO RELATED APPLICATION

This application is a Divisional of U.S. application Ser. No. 10/256,899, filed on Sep. 27, 2002 now U.S. Pat. No. 6,638,859, entitled "Apparatus and Method To Achieve Continuous Interface and Ultrathin Film During Atomic Layer Deposition" which is a Divisional of U.S. application Ser. No. 09/470,279, filed Dec. 22, 1999, which is now U.S. Pat. No. 6,503,330, issued Jan. 7, 2003. +gi The United States Government has rights in this invention pursuant to Contract No. F33615-99-C-2961 between Genus, Inc. and the U.S. Air Force Research Laboratory.

BACKGROUND OF THE INVENTION

The present invention relates generally to semiconductor technology and, more particularly, to a method and apparatus for the practice of atomic layer deposition.

In the manufacture of integrated circuits, many methods are known for depositing and forming various layers on a substrate. Chemical vapor deposition (CVD) and its variant processes are utilized to deposit thin films of uniform and, often times conformal coatings over high-aspect and uneven features present on a wafer. However, as device geometries shrink and component densities increase on a wafer, new processes are needed to deposit ultrathin film layers on a wafer. The standard CVD techniques have difficulty meeting the uniformity and conformity requirements for much thinner films.

One variant of CVD to deposit thinner layers is a process known as atomic layer deposition (ALD). ALD has its roots originally in atomic layer epitaxy, which is described in U.S. Pat. Nos. 4,058,430 and 4,413,022 and in an article titled "Atomic Layer Epitaxy" by Goodman et al.; J. Appl. Phys. 60(3), 1 Aug. 1986; pp. R65–R80. Generally, ALD is a process wherein conventional CVD processes are divided into single-monolayer depositions, wherein each separate deposition step theoretically reaches saturation at a single molecular or atomic monolayer thickness or less and, then, self-terminates.

The deposition is an outcome of chemical reactions between reactive molecular precursors and the substrate (either the base substrate or layers formed on the base substrate). The elements comprising the film are delivered as molecular precursors. The desired net reaction is to deposit a pure film and eliminate "extra" atoms (molecules) that comprise the molecular precursors (ligands). In a standard CVD process, the precursors are fed simultaneously into the reactor. In an ALD process, the precursors are introduced into the reactor separately, typically by alternating the flow, so that only one precursor at a time is introduced into the reactor. For example, the first precursor could be a metal precursor containing a metal element M, which is bonded to an atomic or molecular ligand L to form a volatile molecule $ML_x$. The metal precursor reacts with the substrate to deposit a monolayer of the metal M with its passivating ligand. The chamber is purged and, then, followed by an introduction of a second precursor. The second precursor is introduced to restore the surface reactivity towards the metal precursor for depositing the next layer of metal. Thus, ALD allows for single layer growth per cycle, so that much tighter thickness controls can be exercised over standard CVD process. The tighter controls allow for ultrathin films to be grown.

In practicing CVD, a nucleation step is assumed when a film of stable material is deposited on a stable substrate. Nucleation is an outcome of only partial bonding between the substrate and the film being deposited. Molecular precursors of CVD processes attach to the surface by a direct surface reaction with a reactive site or by CVD reaction between the reactive ingredients on the surface. Of the two, the CVD reaction between the reactive ingredients is more prevalent, since the ingredients have much higher affinity for attachment to each other. Only a small fraction of the initial film growth is due to direct surface reaction.

An example of nucleation is illustrated in FIGS. 1–3. FIG. 1 shows a substrate 10 having bonding locations 11 on a surface of the substrate. Assuming that the CVD reaction involves a metal (M) and a ligand ($L_x$) reacting with a non-metal (A) and hydrogen ($H_z$), the adsorbed species diffuse on the surface and react upon successful $ML_x$—$AH_z$ collisions. However, the reaction does not occur at all of the potential attachment (or bonding) locations 11. Generally, defect sites (sites having irregular topology or impurity) are likely to trap molecular precursors for extended times and, therefore, have higher probability to initiate nucleation. In any event, as shown in FIG. 1, the bonding of the precursor to the surface occurs at only some of the bonding locations 12.

Subsequently, as shown in FIG. 2, the initial bonding sites 12 commence to further grow the thin film material on the surface of the substrate 10. The initial reaction products on the surface are the nucleation seed, since the attached products are immobile and diffusing molecular precursors have a high probability to collide with them and react. The process results in the growing of islands 13 on the substrate surface together with the continuous process of creating new nucleation sites 14. However, as the islands 13 grow larger, the formation of new nucleation seeds is suppressed because most of the collisions occur at the large boundaries of the islands 13.

As the islands 13 enlarge three-dimensionally, most of the adsorption and reaction processes occur on the island surfaces, especially along the upper surface area of the islands 13. Eventually, this vertical growth results in the islands becoming grains. When the grains finally coalesce into a continuous film, the thickness could be on the order of 50 angstroms. However, as shown in FIG. 3, the separated nucleation sites can result in the formation of grain boundaries and voids 15 along the surface of the substrate, where potential bonding sites failed to effect a bond with the precursor(s). The grain boundaries and voids 15 leave bonding gaps along the surface of the substrate so that substantial film height will need to be reached before a continuous upper surface of the film layer is formed.

Although the results described above from nucleation is a problem with the standard CVD process, the effect is amplified with ALD. Since ALD utilizes one precursor at a time, the initial bonding will occur due to surface reaction of the initial precursor with sparse surface defects. Accordingly, seed nucleation sites 12 are very sparse (more sparse than CVD) and nucleation proceeds by growing ALD layers on these few seed sites. As a result, the nuclei grow three-dimensional islands 13 and coalesce only at thickness that are comparable to the distance between the nucleation seeds. That is, the voids 15 could be much larger in size, so that a much higher structure is needed to provide a continuos upper surface for the film when only ALD is used.

Accordingly, if an ALD film can initiate growth on a substrate predominantly by nucleation, the film grows discontinuously for a much thicker distance. Ultimately a much thicker film is practically needed in the case of ALD to achieve continuous film, than that which can be obtained from CVD processes.

The present invention is directed to providing a technique to deposit ALD thin films of reduced thickness that has continuous interface and film.

SUMMARY OF THE INVENTION

A method and apparatus for performing atomic layer deposition in which a surface of a substrate is pretreated to make the surface of the substrate reactive for performing atomic layer deposition (ALD). As a result, the ALD process can start continuously without nucleation or incubation, so that continuous interfaces and ultrathin films are formed.

DETAILED DESCRIPTION OF THE INVENTION

The practice of atomic layer deposition (ALD) to deposit a film layer onto a substrate, such as a semiconductor wafer, requires separately introducing molecular precursors into a processing reactor. The ALD technique will deposit an ultrathin film layer atop the substrate. The term substrate is used herein to indicate either a base substrate or a material layer formed on a base substrate, such as a silicon substrate. The growth of the ALD layer follows the chemistries associated with chemical vapor deposition (CVD), but the precursors are introduced separately.

In an example ALD process for practicing the present invention, the first precursor introduced is a metal precursor comprising a metal element M bonded to atomic or molecular ligand L to make a volatile molecule $ML_x$ (the x, y and z subscripts are utilized herein to denote integers 1, 2, 3, etc.). It is desirable that the $ML_x$ molecule bond with a ligand attached to the surface of the substrate. An example ligand is a hydrogen-containing ligand, such as AH, where A is a nonmetal element bonded to hydrogen. Thus, the desired reaction is noted as $AH+ML_x \rightarrow AML_y+HL$, where HL is the exchange reaction by-product.

However, in a typical situation as noted in the Background section above, the substrate surface does not possess ample bonding sites for all the potential locations on the surface. Accordingly, the $ML_x$ precursor bonding to the surface can result in the formation of islands and grains which are sufficiently far apart to cause the problems noted above. In order to grow continuous interfaces and films, the present invention is practiced to pretreat the surface of the substrate prior to ALD in order to have the surface more susceptible to ALD. In the preferred embodiment the substrate surface is first treated to make the surface more reactive. This is achieved by forming reactive termination on the surface which will then react with the first ALD precursor.

Figure 1:
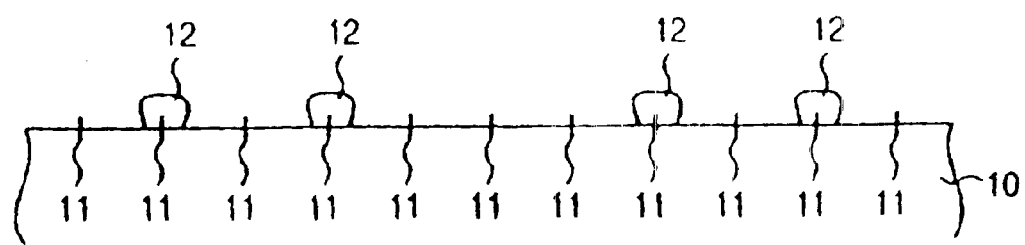
FIG. 1 is a cross-sectional diagram showing a problem encountered with prior art CVD processes, in which sparse seed nuclei are formed to initiate film growth by non-continuous nucleation.
Figure 2:
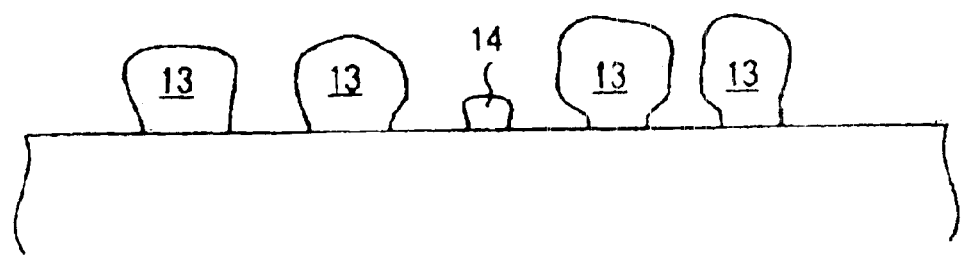
FIG. 2 is a cross-sectional diagram showing the start of nucleation emanating from the chemical attachment shown in FIG. 1, in which the spacing between the nucleation sites results in the formation of separated islands as the deposition process progresses.
Figure 3:
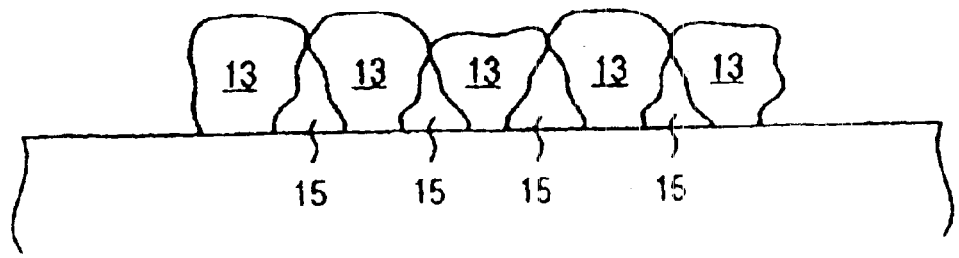
FIG. 3 is a cross-sectional diagram showing the result of further growth of the deposited layer of FIG. 2, in which the formation of grain boundaries and voids requires more than desirable thickness to be deposited to obtain a continuous layer at the surface.
Figure 4:
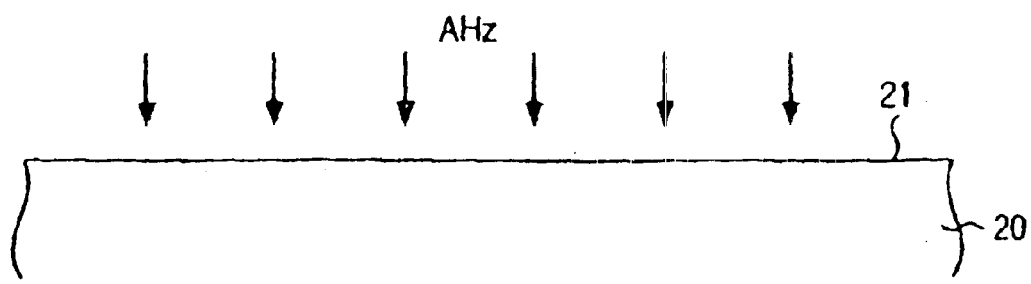
FIG. 4 is a cross-sectional diagram showing an embodiment of the present invention in pretreating a surface of a substrate to activate the surface, prior to performing atomic layer deposition to grow an ultra thin film layer.

FIG. 4 shows one embodiment for practicing the present invention. In FIG. 4, a substrate 20 (again, substrate is used herein to refer to either a base substrate or a material layer formed on a base substrate) is shown upon which ALD is performed. Instead of applying the $ML_x$ precursor initially onto the substrate 20, one or more radical specie(s), including such species as oxygen, hydrogen, OH, $NH_2$, Cl and F, is introduced to react with a surface 21 of the substrate 20. The species can be remote plasma generated and carried to the processing chamber. The reactive species can be selected to react with most surfaces, however, the particular specie selected will depend on the surface chemistry. A given specie is utilized to modify the surface 21. The reactive specie typically will modify the surface by exchanging other surface species and/or attaching to previously reconstructed sites.

For example, $SiO_2$ surface with approximately 100% siloxane SiOSi bridge is generally inert. OH, H or O radical exposure can efficiently insert HOH into the SiOSi to generate 2 Si—OH surface species that are highly reactive with $ML_x$ molecular precursor. In FIG. 4, a generic $AH_z$ reaction is shown to treat the surface 21 of the substrate 20. A number of example reactions using a particular species to treat various surfaces is described later below.

Figure 5:
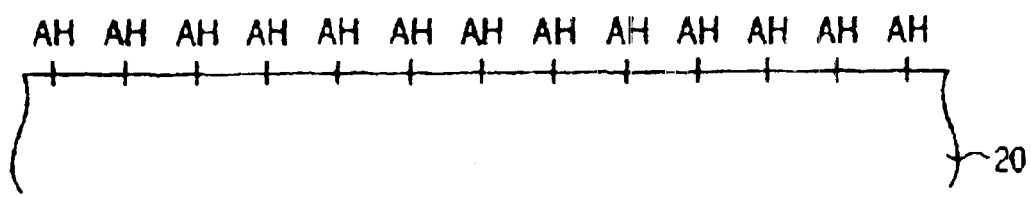
FIG. 5 is a cross-sectional diagram showing the presence of many more active sites on the surface of the substrate after surface pretreatment shown in FIG. 4 is performed.
Figure 6:
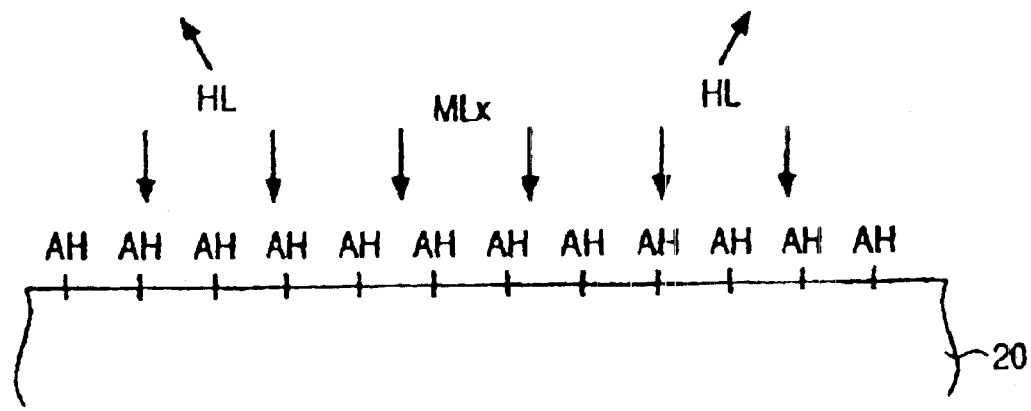
FIG. 6 is a cross-sectional diagram showing a first sequence for performing ALD when a first precursor is introduced to the prepared surface of FIG. 5.

The introduction of the pretreatment plasma into the processing chamber containing the substrate 20 results in the formation of surface species at various desired bonding sites. Thus, as shown in FIG. 5, the surface is shown containing AH sites. It is desirable to have the AH species at many of the potential bonding sites. Subsequently, as shown in FIG. 6, the first precursor. $ML_x$ is introduced to start the ALD process for growing a film layer having the composition MA.

It should be noted that the prior art practice of performing ALD commences by the introduction of $ML_x$. Since the prior art does not pretreat the surface 21, there is a tendency for the surface to have lot less potential bonding sites. That is, there are lot less AH sites on non-treated surfaces versus the number available for the pretreated surface 21 shown in FIG. 6. Accordingly, with less bonding sites on the surface, the earlier described problems associated with nucleation can occur. However, the pretreated surface 21 allows for many more bonding sites to be present on the surface to reduce the above-noted problem.

Figure 7:
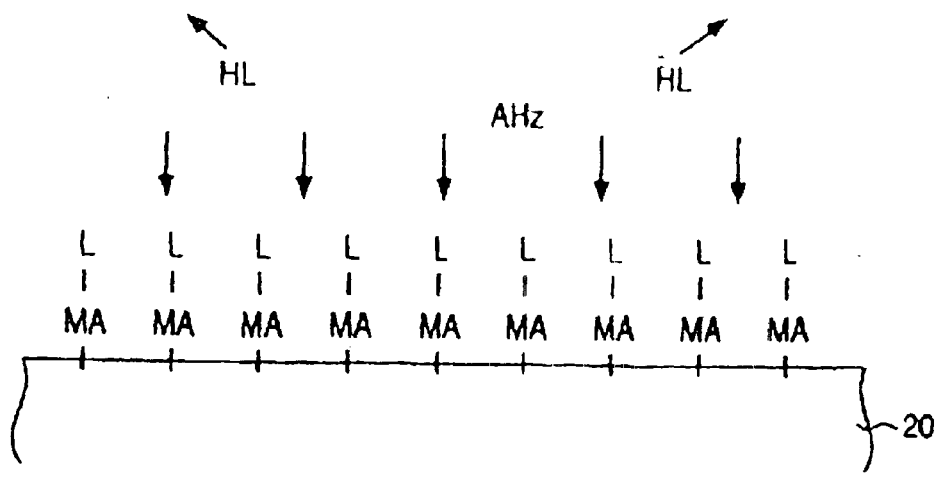
FIG. 7 is a cross-sectional diagram showing a formation of ligands on the substrate surface of FIG. 6 after the first precursor reacts with the pretreated surface and the subsequent introduction of a second precursor.
Figure 8:
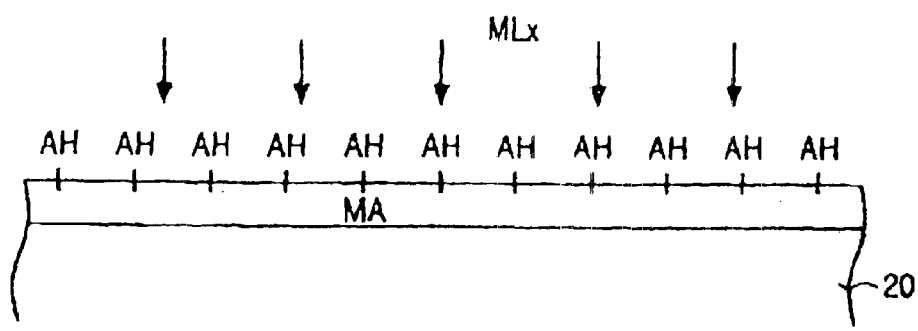
FIG. 8 is a cross-sectional diagram showing the restoration of the substrate surface of FIG. 7 so that the first precursor can be reintroduced to repeat the ALD cycle for film growth and, in addition, a continuous interface layer of the desired film is deposited on the substrate by the sequences of FIGS. 5–7.
Figure 9:
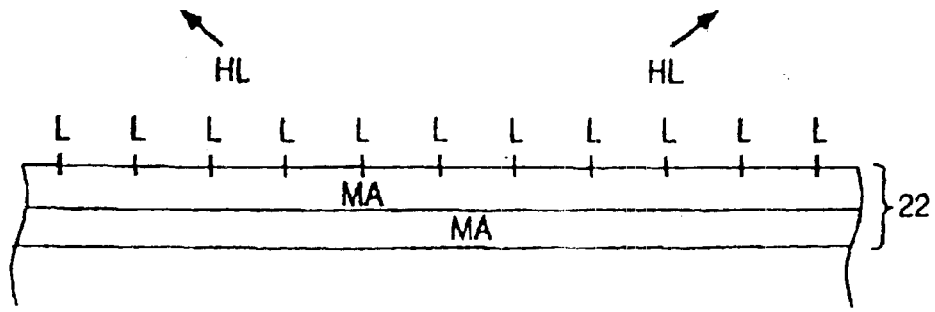
FIG. 9 is a cross-sectional diagram showing a formation of a next ALD monolayer atop the first monolayer shown in FIG. 8 to further grow the layer above the substrate one atomic/molecular layer at a time.

FIGS. 7–9 show the remaining sequence for performing ALD. After the $ML_x$ precursor is introduced, the $AH+ML_x \rightarrow AML_y+HL$ reaction occurs, wherein HL is exchanged as the reaction by-product. As shown in FIG. 7, the surface of the substrate 21 now contains the MA-L combination, which then reacts with the second precursor comprising $AH_z$. The second precursor, shown here comprising a nonmetal element A and hydrogen reacts with the L terminated sites on the surface 21. The hydrogen component is typically represented by $H_2O$, $NH_3$ or $H_2S$. The reaction $ML+AH_z \rightarrow MAH+HL$ results in the desired additional element A being deposited as AH terminated sites and the ligand L is eliminated as a volatile by-product HL. The surface 21 now has AH terminated sites, as shown in FIG. 8.

At this point of the process, the first precursor has been introduced and deposited by ALD, followed by the second precursor, also by ALD. The sequence of surface reactions restores the surface 21 to the initial condition prior to the $ML_x$ deposition, thereby completing the ALD deposition cycle. Since each ALD deposition step is self-saturating, each reaction only proceeds until the surface sites are consumed. Therefore, ALD allows films to be layered down in equal metered sequences that are identical in chemical kinematics, deposition per cycle, composition and thickness. Self-saturating surface reactions make ALD insensitive to transport non-uniformity either from flow engineering or surface topography, which is not the case with other CVD techniques. With the other CVD techniques, non-uniform flux can result in different completion time at different areas, resulting in non-uniformity or non-conformity. ALD, due to its monolayer limiting reaction, can provide improved uniformity and/or conformity over other CVD techniques.

FIG. 9 illustrates the result of a subsequent ALD formation of the MA layer when the next $ML_x$ sequence is performed to the surface of the substrate shown in FIG. 8. Thus, additional ALD deposition cycles will further grow the film layer 22 on the surface 21, one atomic or molecular layer at a time, until a desired thickness is reached. With the pretreatment of the surface 21, nucleation problems noted earlier are inhibited, due to ample bonding sites on the surface. Thus, the initial ALD layers, as well as subsequent ALD layers, will have ample bonding sites on the surface to attach the reactive species. Continuous ultrathin film layers of 50 angstroms and under can be deposited with acceptable uniformity and conformity properties when practicing the present invention.

Figure 10:
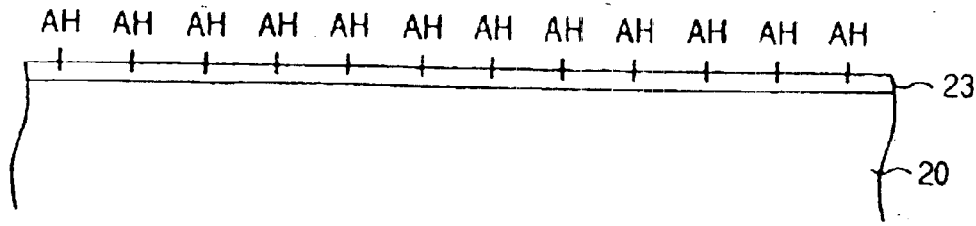
FIG. 10 is a cross-sectional diagram showing an alternative pretreatment technique in which an intermediate layer is formed to provide activation sites on the surface of the substrate prior to performing ALD.

It is appreciated that the pretreatment of the surface 21 can be achieved to deposit enough radical species to exchange with the surface. In this instance, these radical species (shown as AH in the example illustrated) provide termination sites for bonding to the $ML_x$ precursor. However, in some instances, it may be desirable to actually deposit an intermediate layer above the surface 21. In this instance, an actual intermediate layer 23 is formed above the surface 21 and in which the termination sites are actually present on this layer 23. This is illustrated in FIG. 10. Again, this layer can be deposited by a plasma process, including ALD. Then, the ALD process sequence, commencing with the deposition of $ML_x$ can commence.

An intermediate layer may be required in some instances when the substrate cannot be made reactive with either of the ALD molecular precursors by a simple attachment or exchange of surface species. The ultra thin intermediate layer 23 is deposited as part of the pretreatment process. The intermediate layer 23 provides a new surface that is reactive to one or both precursors. The layer 23 is formed having a thickness which is kept minimal but sufficient for activation. The intermediate layer 23 may be conductive, semiconductive or insulating (dielectric). Typically, it will match the electrical properties of either the substrate 20 or the overlying film being grown. For example, layer 23 is needed as a transition layer when W or $WN_x$ films are deposited on $SiO_2$. In this instance, $Al_2O_3$ (which is an insulator) or TiN, Ti, Ta or $Ta_xN$ (which are conductors) can be used for the intermediate layer 23.

It is to be noted further, that the intermediate layer 23 can be deposited by ALD for the pretreatment of the surface. Additionally, the surface 21 of the substrate 20 can be pretreated first by the first method described above to prepare the surface 21 for the deposition of the intermediate layer 23. Although this does require additional process, it may be desirable in some instances.

It is appreciated that the pretreatment of surface 21 is achieved by a plasma process in the above description, including the use of ALD. However, other techniques can be used instead of a plasma process to pretreat the surface 21. Thus, the surface 21 can be treated, even the intermediate layer 23 grown, by other techniques. Furthermore, a leaching process can be utilized. Since some surfaces are quite inert, a process other than reactive exchange or attachment may be desirable. For example, hydrocarbon and fluorocarbon polymers are utilized for low-k dielectrics. Adhesion of films, for sealing (insulating) or for forming a barrier (metals, metal nitrides), is difficult to achieve. In these instances, leaching hydrogen or fluorine from the top layer of the polymer can activate the surface for ALD.

Thus, a number of techniques are available for pretreating a surface of a substrate so that the surface is more active for ALD. The present invention can be implemented in practice by a number of chemistries and chemical reactions. A number of examples are provided below with relevant equations. It is to be understood that the examples listed below are provided as examples and in no way limit the invention to just these examples.

EXAMPLE 1

ALD deposition of $Al_2O_3$ on silicon. A silicon substrate is first activated (pretreated) by forming thin layers of silicon oxide ($SiO_2$) or silicon oxinitride, in which OH and/or $NH_x$ groups form the terminations. The process involves $O_2/H_2/H_2O/NH_3$ remote plasma that includes different ratios of the constituents to form the terminations prior to the introduction of the first precursor to grow the $Al_2O_3$ thin film layer on silicon.

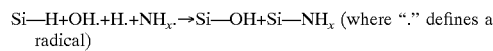
Si—H.+OH.+H.+$NH_x$.→Si—OH+Si—$NH_x$ (where "." defines a radical)

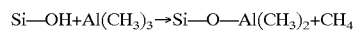
Si—OH+Al(CH$_3$)$_3$→Si—O—Al(CH$_3$)$_2$+CH$_4$

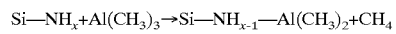
Si—$NH_x$+Al(CH$_3$)$_3$→Si—$NH_{x-1}$—Al(CH$_3$)$_2$+CH$_4$

EXAMPLE 2

ALD deposition of $Al_2O_3$ on silicon. The silicon substrate is activated by forming thin layers of $SiO_2$ that is hydroxilated by exposing HF cleaned (H terminated) silicon to a pulse of $H_2O$ at temperatures below 430° C. This process results in a self-saturated layer of $SiO_2$ that is approximately 5 angstroms thick.

$$Si—H+H_2O_4 \rightarrow Si—O—Si—OH+H_2$$

$$Si—OH+Al(CH_3)_3 \rightarrow Si—O—Al(CH_3)_2+CH_4$$

EXAMPLE 3

ALD deposition of $Al_2O_3$ on $WN_x$. $NH_3/H_2/N_2$ plasma is used to leach fluorine from the top layers of the $WN_x$ film and terminate the surface with $NH_x$ species. These species are reacted with trimethyl aluminum (TMA) to initiate deposition of $Al_2O_3$ on $WN_x$.

$$W_xN+H.+NH_x. \rightarrow W—NH_x$$

$$W—NH_x+Al(CH_3)_3 \rightarrow W—NH_{x-1}—Al(CH_3)_2+CH_4$$

EXAMPLE 4

ALD deposition of $Al_2O_3$ on TiN. $NH_3/H_2/N_2$ plasma is used to terminate the surface with $NH_x$ species. These species are reacted with TMA to initiate $Al_2O_3$ ALD.

$$TiN+H.+NH_x. \rightarrow Ti—NH_x$$

$$TiNH_x+Al(CH_3)_3 \rightarrow TiNH_{x-1}—Al(CH_3)_2+CH_4$$

EXAMPLE 5

ALD deposition of $Al_2O_3$ on Ti. $NH_3/H_2/N_2$ plasma is used to nitridize the surface and terminate the surface with $NH_x$ species. Maintain conditions to avoid extensive nitridization into the Ti film. The $NH_x$ species are reacted with TMA to initiate $Al_2O_3$ ALD.

$$Ti+NH_x.+H. \rightarrow TiNH_x$$

$$TiNH_x+Al(CH_3)_3 \rightarrow TiNH_{x-1}—Al(CH_3)_2+CH_4$$

EXAMPLE 6

ALD deposition of $Al_2O_3$ on W. $NH_3/H_2/N_2$ plasma is used to nitridize the surface and terminate the surface with $NH_x$ species. Maintain conditions to avoid extensive nitridization into the W film. The $NH_x$ species are reacted with TMA to initiate $Al_2O_3$ ALD.

$$W+NH_x.+H. \rightarrow WNH_x$$

$$W—NH_x+Al(CH_3)_3 \rightarrow W—NH_{x-1}—Al(CH_3)_2+CH_4$$

EXAMPLE 7

ALD deposition of $Al_2O_3$ on Ta. $NH_3/H_2/N_2$ plasma is used to nitridize the surface and terminate the surface with $NH_x$ species. Maintain conditions to avoid extensive nitridization into the Ta film. The $NH_x$ species are reacted with TMA to initiate $Al_2O_3$ ALD.

$$Ta+NH_x.+H. \rightarrow TaNH_x$$

$$TaNH_x+Al(CH_3)_3 \rightarrow TaNH_{x-1}—Al(CH_3)_2+CH_4$$

EXAMPLE 8

ALD deposition of $Al_2O_3$ on $Ta_xN$. $NH_3/H_2/N_2$ plasma is used to terminate the surface with $NH_x$ species. The $NH_x$ species are reacted with TMA to initiate $Al_2O_3$ ALD.

$$Ta_xN+NH_x.+H. \rightarrow TaNH_x$$

$$TaNH_x+Al(CH_3)_3 \rightarrow TaNH_{x-1}—Al(CH_3)_2+CH_4$$

EXAMPLE 9

ALD deposition of $Ta_2O_5$ on $Al_2O_3$. The process involves $O_2/H_2/H_2O$ remote plasma that includes different ratios of the constituents. This plasma is used to terminate the surface with OH species that are reactive with $TaCl_5$.

$$Al_2O_3+OH.+O.+H. \rightarrow Al_2O_3—OH$$

$$Al_2O_3—OH+TaCl_5 \rightarrow Al_2O_3—O—TaCl_4+HCl$$

Equation 10: ALD deposition of $Al_2O_3$ on $Ta_2O_5$. The process involves $O_2/H_2/H_2O$ remote plasma that includes different ratios of the constituents. This plasma is used to terminate the surface with OH species that are reactive with $TaCl_5$.

$$Ta_2O_5+O.+H.+OH. \rightarrow Ta_2O_5—OH$$

$$Ta_2O_5—OH+Al(CH_3)_3 \rightarrow Ta_2O_5—O—Al(CH_3)_2+CH_4$$

EXAMPLE 11

ALD deposition of $TiO_x$ on $Al_2O_3$. The process involves $O_2H_2/H_2O$ remote plasma that includes different ratios of the constituents. This plasma is used to terminate the surface with OH species that are reactive with TMA.

$$Al_2O_3+O.+H.+OH. \rightarrow Al_2O_3—OH$$

$$Al_2O_3—OH+TiCl_4 \rightarrow Al_2O_3—O—TiCl_3+HCl$$

EXAMPLE 12

ALD deposition of $Al_2O_3$ on $TiO_x$. The process involves $O_2/H_2/H_2O$ remote plasma that includes different ratios of the constituents. This plasma is used to terminate the surface with OH species that are reactive with $TiCl_4$.

$$TiO_2+O.+H.+OH. \rightarrow TiO_2—OH$$

$$TiO_2—OH+Al(CH_3)_3 \rightarrow TiO_2—O—Al(CH_3)_2+CH_4$$

EXAMPLE 13

ALD deposition of $TiO_x$ on TiN. $NH_3/H_2/N_2$ plasma is used to terminate the surface with $NH_x$ species. The $NH_x$ species are reacted with $TiCl_4$ to initiate $TiO_x$ ALD.

$$TiN+H.+NH_x. \rightarrow Ti—NH_x$$

$$Ti—NH_x+TiCl_4 \rightarrow TiNH_{x-1}—TiCL_3+HCl$$

EXAMPLE 14

ALD deposition of W on TiN. $NH_3/H_2/N_2$ plasma is used to terminate the surface with $NH_x$ species. The $NH_x$ species are reacted with $TiCl_4$ to initiate TiN ALD.

$$TiN+H.+NH_x. \rightarrow Ti—NH_x$$

$$Ti—NH_x+WF_6 \rightarrow TiNH_{x-1}—WF_5+HF$$

EXAMPLE 15

ALD deposition of $WN_x$ on TIN. $NH_3/H_2/N_2$ plasma is used to terminate the surface with $NH_x$ species. The $NH_x$ species are reacted with $TiCl_4$ to initiate $WN_x$ ALD.

$$TiN+H.+NH_x. \rightarrow Ti—NH_x$$

$$Ti—NH_x+WF_6 \rightarrow TiNH_{x-1}—WF_5+HF$$

EXAMPLE 16

ALD deposition of $WN_x$ on $SiO_2$. $O_2/H_2/H_2O$ remote plasma that includes different ratios of the constituents is used to terminate the surface with OH species that are reactive with $TiCl_4$. The $TiCl_4$ species is used to grow an intermediate layer of Ti or TiN. The final layer is terminated with $NH_x$ species (from the TiN ALD) which reacts with $WF_6$ to initiate the $WN_x$ ALD process.

$SiO_2 + H. + O. + OH. \rightarrow Si-OH$ $Si-OH + TiCl_4 \rightarrow SiO-TiCl_3 + HCl$ $SiO-TiCl_3 + NH_3 \rightarrow SiO-TiN-NH_x + HCl$ $SiO-TiN-NH_x + WF_6 \rightarrow SiO-TiN-NH_{x-1}WF_5 + HF$

EXAMPLE 17

ALD deposition of W on $SiO_2$. $O_2/H_2H_2O$ remote plasma that includes different ratios of the constituents is used to terminate the surface with OH species that are reactive with $TiCl_4$. The $TiCl_4$ species is used to grow an intermediate layer of Ti or TN. The final layer is terminated with $NH_x$ species (from the TiN ALD) which reacts with $WF_6$ to initiate the W ALD process.

$SiO_2 + H. + O. + OH. \rightarrow Si-OH$ $Si-OH + TiCl_4 \rightarrow SiO-TiCl_3 + HCl$ $SiO-TiCl_3 + NH_3 \rightarrow SiO-TiN-NH_x + HCl$ $SiO-TiN-NH_x + WF_6 \rightarrow SiO-TiN-NH_{x-1}WF_5 + HF$ Alternatively, $TaCl_5$ can be used for growing an intermediate $Ta_xN$ layer.

EXAMPLE 18

ALD deposition of $WN_x$ on hydrocarbon polymer (low-k dielectric layer). $NF_3$ remote plasma generates fluorine atoms that leach out hydrogen from the hydrocarbon. The leached surface is reacted with $TiCl_4$ and followed by TiN or Ti/TIN ALD of a thin intermediate layer. The $NH_x$ terminated surface that is prepared during the TiN ALD is reacted with $WF_6$ to initiate $WN_x$ ALD.

$C_nH_m + F. \rightarrow C_pH_qC.$ $C_pH_qC. + TiCl_4 \rightarrow C_pH_{q-1}CTiCl_3 + HCl$ $C_pH_{q-1}CTiCl_3 + NH_3 \rightarrow C_pH_{q-1}CTiN-NH_x + HCl$ $C_pH_{q-1}CTiN-NH_x + WF_6 \rightarrow C_pH_{q-1}CTiN-N_{x-1}-WF_5 + HF$

EXAMPLE 19

ALD deposition of $WN_x$ on perfluorocarbon polymer (low-k dielectric layer). $H_2/NH_3$ remote plasma generates H atoms and $NH_x$ radicals that leach out fluorine from the hydrocarbon. The leached surface is reacted with $TiCl_4$ and followed by TiN or Ti/TiN ALD of a thin intermediate layer. The $NH_x$ terminated surface that is prepared during the TIN ALD is reacted with $WF_6$ to initiate $WN_x$ ALD.

$C_mF_n + H. + NH_x. \rightarrow C_pF_qC. + HF$ $C_pF_qC. + TiCl_4 \rightarrow C_pF_qC-TiN-NH_x$ $C_pF_qC-TiN-NH_x + WF_6 \rightarrow C_pF_qC-TiNH_{x-1}-NWF_5 + HF$

EXAMPLE 20

ALD deposition of oxide on another oxide. The surface of the first oxide is activated by $O_2/H_2/H_2O$ remote plasma that includes different ratios of the constituents. This process is used to terminate the surface with OH species that are reactive with a metal precursor for the next oxide layer.

$M1O_x + O. + H. + OH. \rightarrow M1O_x-OH$ $M1O_x-OH + M2L_y \rightarrow M1O_x-O-M2L_{y-1} + HL$

EXAMPLE 21

ALD deposition of oxide on metal, semiconductor or metal nitride $NH_3/H_2/N_2$ plasma is used to terminate the surface with $NH_x$ species that are reactive with a metal precursor for initiating ALD.

$M1 + H. + NH_x. \rightarrow M1-NH_x$ $M1NH_x + M2L_y \rightarrow M1NH_{x-1}M2L_{y-1} + HL$

EXAMPLE 22

ALD deposition of metal, semiconductor or conductive metalnitride on oxide. $NH_3/H_2/N_2$ plasma is used to terminate the surface with $NH_x$ species or $O_2/H_2/H_2O$ plasma generated radicals are used to terminate the surface with OH species. The species are reactive with a metal precursor for initiating ALD.

$M1O_x + O. + H. + OH. \rightarrow M1O_x-OH$ $M1O_x-OH + M2L_y \rightarrow M1O_x-O-M2L_{y-1} + HL$ Again, it is appreciated that the above are described as examples only and that many other ALD reactions and pretreatment procedures are available.

Figure 11:
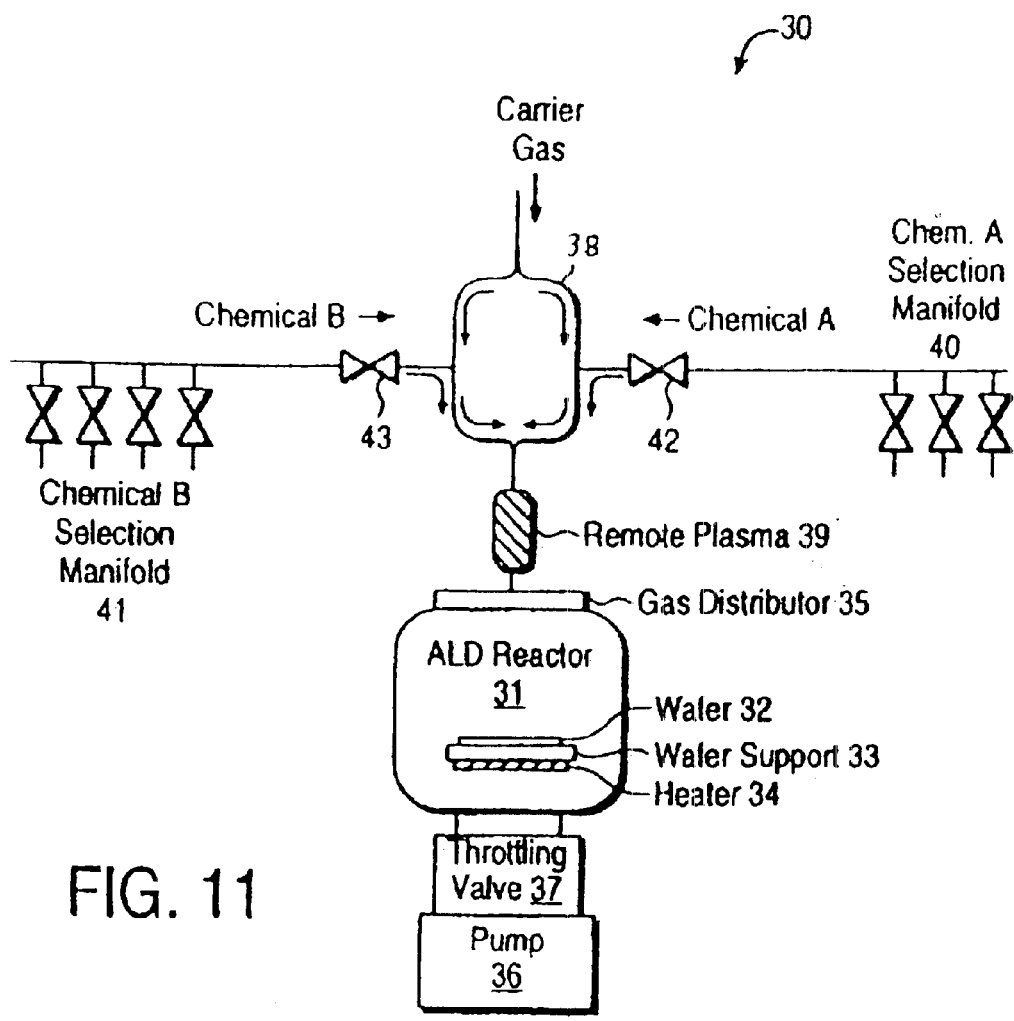
FIG. 11 is a block diagram showing one reactor apparatus for performing ALD, as well as pretreating the surface by practicing the present invention.

Referring to FIG. 11, an apparatus for practicing the present invention is shown. An ALD reactor apparatus 30 is shown as one embodiment. It is appreciated that a variety of other devices and equipment can be utilized to practice the invention. Reactor 30 includes a processing chamber 31 for housing a wafer 32. The wafer 32 comprises the substrate 20 described in the earlier Figures. Typically, the wafer 32 resides atop a support (or chuck) 33. A heater 34 is also coupled to the chuck to heat the chuck 33 and the wafer 32 for plasma deposition. The processing gases are introduced into the chamber 31 through a gas distributor 35 located at one end of the chamber 31. A vacuum pump 36 and a throttling valve 37 are located at the opposite end to draw and regulate the gas flow across the wafer surface.

A mixing manifold 38 is used to mix the various processing gases and the mixed gases are directed to a plasma forming zone 39 for forming the plasma A variety of CVD techniques for combining gases and forming plasma can be utilized, including adapting techniques known in the art. The remotely formed plasma is then fed into gas distributor 35 and then into the chamber 31.

The mixing manifold 38 has two inlets for the introduction of gases and chemicals. A carrier gas is introduced and the flow split at the mixing manifold 38. The carrier gas is typically an inert gas, such as nitrogen. The mixing manifold 38 also has two inlets for the chemicals. In the example diagram of FIG. 11, chemical A and chemical B are shown combined with the carrier gas. Chemistry A pertains to the first precursor and chemistry B pertains to the second precursor for performing ALD for the two precursor process described above. Chemical selection manifold 40 and 41, comprised of a number of regulated valves, provide for the selecting of chemicals that can be used as precursors A and B, respectively. Inlet valves 42 and 43 respectively regulate the introduction of the precursor chemistries A and B into the mixing manifold 38.

The operation of the reactor for performing ALD is as follows. Once the wafer is resident within the processing chamber 31, the chamber environment is brought up to meet desired parameters. For example, raising the temperature of the wafer in order to perform ALD. The flow of carrier gas is turned on so that there is a constant regulated flow of the carrier gas as the gas is drawn by the vacuum created by the pump 36. When ALD is to be performed, valve 42 is opened to allow the first precursor to be introduced into the carrier gas flow. After a preselected time, valve 42 is closed and the carrier gas purges any remaining reactive species. Then, valve 43 is opened to introduce the second precursor into the carrier gas flow. Again after another preselected time, the valve 43 is closed and the carrier gas purges the reactive species form the chambers of the reactor. The two chemicals A and B are alternately introduced into the carrier flow stream to perform the ALD cycle to deposit a film layer.

When the pretreatment of the surface is to be performed by plasma, the pretreating species can be introduced into the mixing manifold through either or both of the chemical selection routes through selection manifold(s) 40, 41 to mix with the carrier gas. Again, the pretreatment is performed prior to the initial introduction of the first ALD precursor used to deposit the film. Accordingly, the introduction of the pretreatment chemistry can be achieved from adapting designs of a standard ALD reactor.

Thus, an apparatus and method to achieve continuous interface and ultrathin film during atomic layer deposition is described. The present invention allows an ALD process to start continuously without nucleation or incubation and allows ultrathin film layers of 50 angstroms or less in thickness to be deposited having continuous uniformity and/or conformity.

We claim:

1. A structure formed on a substrate comprising:
   an insulating layer formed on an existing atomic layer deposition layer in which the insulating layer is pretreated by introducing a radical specie including any combination of $O_2$, $H_2$, $H_2O$, $NH_3$, $NF_3$, $N_2$, Cl and F to increase AHx termination sites on the surface of the insulating layer, where x is an integer and A is a non-metal capable of bonding with hydrogen H; and
   a film layer formed above said insulating layer by repeated introduction of a first precursor followed by a second precursor to deposit said film layer by atomic layer deposition, the first precursor to deposit a first reactive specie on the surface of the insulating layer, the surface when pretreated being more receptive to have additional bonding with the first reactive specie, due to the increase of AHx termination sites on the surface and the second precursor to deposit a second reactive specie to react with the deposited first reactive specie to form said film layer.

2. A method to perform atomic layer deposition comprising:
   pretreating a surface of a substrate or a material layer formed on the substrate by introducing a radical specie including any combination of $O_2$, $H_2$, $H_2O$, $NH_2$, $NF_3$, $N_2$, Cl and F to increase AHx termination sites on the surface, where x is an integer and A is a non-metal capable of bonding with hydrogen H, said pretreating further including introducing the radical specie by a plasma;
   introducing a first precursor to deposit a first reactive specie on the surface, the surface when pretreated being more receptive to have additional bonding with the first reactive specie, due to the increase of AHx termination sites on the surface; and
   introducing a second precursor, after the bonding of the first reactive specie, to deposit a second reactive specie to react with the deposit first reactive specie to form a film layer;
   wherein $Al_2O_3$ is deposited on TiXN, wherein X may be Al, Si or W by atomic layer deposition in which said pretreating includes introducing $NH_3/H_2/N_2$ plasma to form NHx as the termination sites on $Al_2O_3$.

3. A method to perform atomic layer deposition comprising:
   pretreating a surface of a substrate or a material layer formed on the substrate by introducing a radical specie including any combination of $O_2$, $H_2$, $H_2O$, $NH_2$, $NF_3$, $N_2$, $C_1$ and F to increase AHx termination sites on the surface, where x is an integer and A is a non-metal capable of bonding with hydrogen H, said pretreating further including introducing the radical specie by a plasma;
   introducing a first precursor to deposit a first reactive specie on the surface, the surface when pretreated being more receptive to have additional bonding with the first reactive specie, due to the increase of AHx termination sites on the surface; and
   introducing a second precursor, after the bonding of the first reactive specie, to deposit a second reactive specie to react with the deposit first reactive specie to form a film layer;
   wherein $HfO_2$, $ZrO_2$ or $La_2O_3$ is deposited on $Al_2O_3$ by atomic layer deposition in which said pretreating includes introducing $O_2/H_2/H_2O$ plasma to form NHx as the termination sites on TiN.

* * * * *